United States Patent [19]
Riley

[11] Patent Number: 5,709,359
[45] Date of Patent: Jan. 20, 1998

[54] EQUIPMENT MOUNTING BRACKETS

[75] Inventor: Richard F. Riley, Auburn, Calif.

[73] Assignee: Hewlett-Packard Company, Palo Alto, Calif.

[21] Appl. No.: 536,293

[22] Filed: Sep. 29, 1995

[51] Int. Cl.[6] ............................................... F16M 11/00
[52] U.S. Cl. ........................... 248/201; 248/300; 248/675; 211/103
[58] Field of Search ................................. 248/247, 300, 248/675, 674, 201, 27.1, 906; 211/26, 103

[56] References Cited

U.S. PATENT DOCUMENTS

| | | | |
|---|---|---|---|
| 882,835 | 3/1908 | McGillivray | 248/300 |
| 1,504,478 | 8/1924 | Hyser | 248/201 |
| 2,117,233 | 5/1938 | Clark | 248/300 |
| 2,143,278 | 1/1939 | Myers | 248/906 |
| 3,024,937 | 3/1962 | Kooi | 248/300 |
| 4,033,531 | 7/1977 | LeVine | 248/676 |
| 4,854,533 | 8/1989 | Sainato | 248/201 |
| 5,240,217 | 8/1993 | Lizakowski | 248/300 |
| 5,460,348 | 10/1995 | Cox | 248/638 |

*Primary Examiner*—Ramon O. Ramirez
*Assistant Examiner*—Gwendolyn W. Baxter
*Attorney, Agent, or Firm*—Douglas M. Gilbert

[57] ABSTRACT

A pair of equipment brackets is disclosed which facilitates mounting electrical equipment and the like in an equipment rack or cabinet. Each bracket attaches to the side panels of the electrical equipment and a portion of the bracket extends outward from the equipment to overlap the side rails of the equipment rack/cabinet. The overlapping portion of each bracket contains a plurality of bore holes arranged in a pattern to match the spacing of the tapped bores in the side rails. The overlapping portion of each bracket also contains a semi-circular slot located at the bottom edge of the bracket. The purpose of the slot in each bracket is to receive a mounting screw partially inserted into the equipment rack. When two such screws are partially inserted into the equipment rack, one on each side at the desired location for mounting the electrical equipment, the overlapping portion of each bracket can be slid down the rack so that the slots receive the screw shaft. The equipment is captured between the surface of the rack and the head of the screws, and thus is temporarily supported on the equipment rack to enable the equipment installer to insert and tighten the remaining supporting screws in the bracket and equipment rack/cabinet.

13 Claims, 3 Drawing Sheets

EQUIPMENT MOUNTING BRACKETS

BACKGROUND OF THE INVENTION

This invention pertains generally to mounting brackets, and more particularly, to an equipment mounting bracket design for use in attaching heavy articles to a standard equipment rack or cabinet.

In the electrical and telecommunication industries various electrical apparatus are typically installed in commercial buildings in standardized equipment racks. For example, the telephone industry in the United States typically uses a standard 19" (48.26 cm) wide rack made of either galvanized steel or aluminum channels as the means for supporting equipment used in the business. Telephone utilities in other countries use similar racks, but often of slightly different dimensions. But, common to all such equipment racks are threaded holes laid out in predetermined patterns to provide a convenient means of attaching equipment to these racks using appropriate screws and brackets. Providers of electrical or electronic equipment design their products with these standards in mind. The width of equipment shelves generally corresponds to the width of standard racks, and permanent mounting flanges or detachable brackets are provided for rack mounting of the equipment. Other industries that manufacture or purchase electronic or computer equipment often employ metal cabinets or specialized equipment racks having similar standardized widths for mounting such apparatus in a convenient and stable position.

The actual mounting of such equipment into a rack can be a non-trivial task depending on the size and weight of the equipment. In many cases the equipment is heavily cantilevered to the rear of a rack rather than being balanced over the point of attachment to the rack. Installers begin the installation process by manually lifting the equipment into the desired location on the rack. The location on the rack must be precise so that the holes in the equipment bracket align with the desired holes in the rack. When the holes are in alignment, a machine screw can be inserted to hold one side of the equipment in the rack. When there is only one installer, which is usually the situation, the individual installer must balance the equipment with one hand, while attempting to thread a screw with the other hand. Any movement of the equipment causes misalignment preventing the screws from being inserted into the threaded holes in the rack. After the first screw is initially threaded, the installer finger tightens the screw, and then repeats the process on the other side of the equipment. When the weight of the equipment is shifted from one hand to the other, the equipment often moves, and the holes in the equipment bracket and the equipment rack have to be realigned on the unsecured side. When both sides are secured, the remaining screws can be inserted and tightened for a permanent installation. The entire process requires some physical dexterity when balancing the equipment with one hand and attempting to thread a screw with the other hand. This exercise is compounded when the equipment is rather heavy. And, this manual process becomes impossible when the equipment is so heavy that it can only be elevated or supported against a rack with two hands. In such situations a second installer is required to hold the equipment in place on the rack while the other one completes the mounting process. Alternatively lifting devices may be used (e.g., a "lift truck"), but these machines are cumbersome to use and certainly time consuming.

What is needed is a device to hold light or heavy equipment or equipment shelves in place at almost any vertical location on an equipment rack when mounting screws are inserted and tightened for permanent installation.

What is also needed is a simple device that can be used by an individual installer.

SUMMARY OF THE INVENTION

In accordance with the teachings of the present invention, these and other objectives are achieved through a novel pair of equipment brackets useful in mounting electrical equipment and the like in an equipment rack or cabinet. Each bracket attaches to the side panels of the electrical equipment and a portion of the bracket extends outward from the equipment to overlap the side rails of the equipment rack/cabinet. The overlapping portion of each bracket contains a plurality of bore holes arranged in a pattern to match the spacing of the tapped bores in the side rails of the equipment rack. The overlapping portion of each bracket also contains a semi-circular slot located at the bottom edge of the bracket. The purpose of each such slot is to receive a mounting screw partially inserted into a tapped bores in the equipment rack. When two such screws are partially inserted into the equipment rack, one in each side at the desired location for mounting the electrical equipment, the overlapping portion of each bracket can be slid down upon the screw body or shaft until received by the semi-circular slots. The equipment is captured between the surface of the rack and the head of the screws, and thus is temporarily supported on the equipment rack to enable the equipment installer to insert and tighten the remaining supporting screws in the bracket and equipment rack/cabinet.

In another aspect of this invention, the bracket previously mentioned can be incorporated in an equipment shelf itself. Many such electrical equipment shelves contain a pair of side flanges extending from the opposing sides of the shelf for mounting the shelves in an equipment rack/cabinet. Like the bracket these side flanges contain a plurality of bore holes arranged in a pattern to match the spacing of the tapped bores in the side rails of the equipment rack. By placing a similar semi-circular slot at the bottom edge of each such flange, the slot can advantageously receive a mounting screw partially inserted into one of the tapped bores in the equipment rack, and thereby temporarily support the equipment shelf in a desired location while the equipment installer inserts and tightens the remaining supporting screws.

In yet another embodiment of this invention, the bracket previously mentioned can also be incorporated into the faceplate of an equipment shelf. Many such electrical equipment shelves contain a faceplate with pair of flanges extending from the opposing sides of the shelf faceplate for mounting the assembly. These flanges contain a plurality of bore holes arranged in a pattern to match the spacing of the tapped bores in the side rails of the equipment rack. By placing a similar semi-circular slot at the bottom edge of each such faceplate flange, the slot can advantageously receive a mounting screw partially inserted into each side of the equipment rack, and thereby temporarily support the equipment shelf in a desired location in the equipment rack.

BRIEF DESCRIPTION OF THE DRAWINGS

For a better understanding of the invention as well as other objects and further features thereof, reference is made to the accompanying drawings wherein.

DETAILED DESCRIPTION

Figure 1:
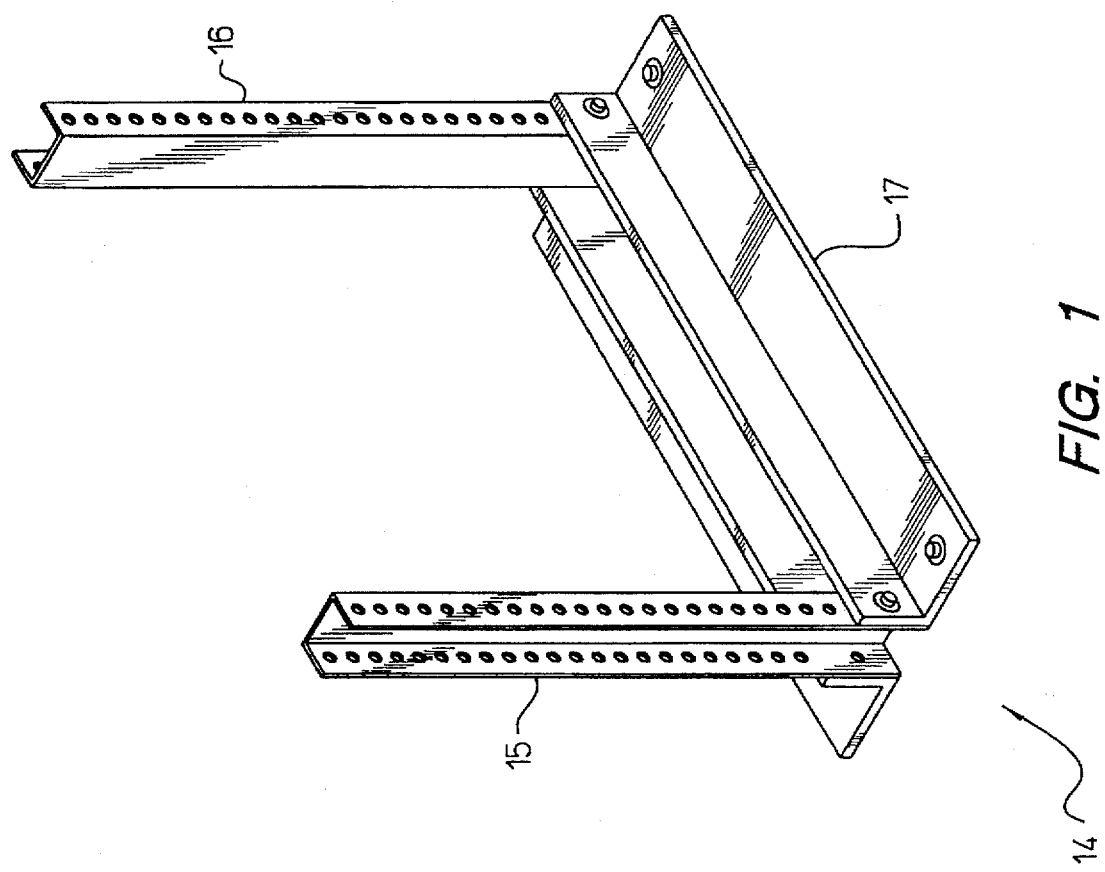
FIG. 1 is a perspective view of a section of a standard equipment rack used in various industries for mounting electrical equipment in a permanent location.
Figure 2A:
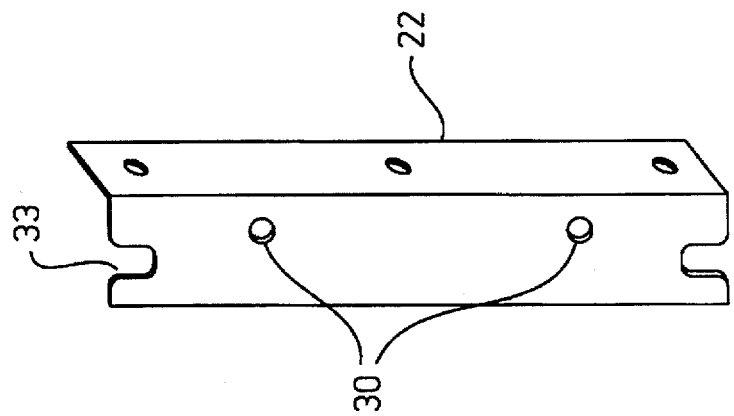
FIG. 2a is an enlarged front perspective view of the bracket shown in FIG. 2 in accordance with one aspect of the present invention.
Figure 2:
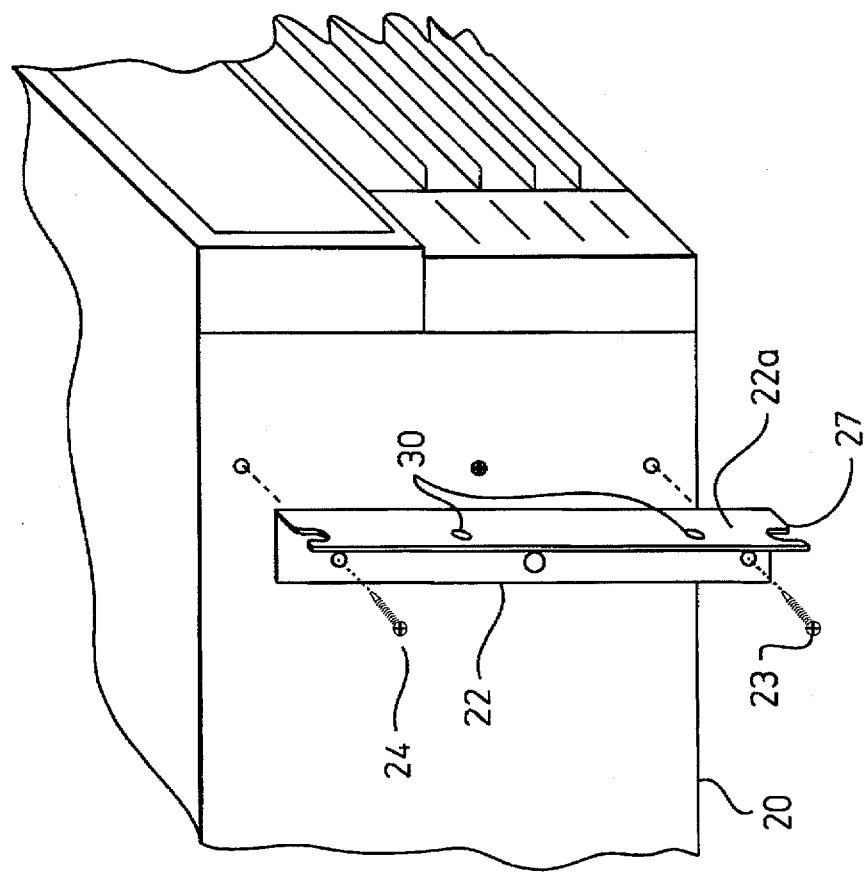
FIG. 2 is a partially exploded perspective view of an electrical equipment shelf and a mounting bracket for use in conjunction therewith.

For a better understanding of the subject invention, reference is made to the following description and to the above-described drawings. FIG. 1 illustrates a standard equipment rack 14 employed by various industries to permanently hold various types of electrical equipment in place. The rack consists of a pair of heavy gauge channels 15 and 16 drilled and tapped for a particular type of machine screw. Although these racks are usually attached to a base assembly 17 for affixing the rack to the floor of an equipment room, ceiling or side supports are also employed. The support mechanism will not affect the subject invention. FIG. 2 depicts a piece of electrical equipment 20 to be mounted and secured in rack 14. Mounting bracket 22 is provided to facilitate mounting the equipment in the rack. It consists of a simple angle iron having a bore hole pattern on both faces to match the threaded bore spacing of the electrical equipment 20 and rack 14. Such would be employed for attaching bracket 22 to equipment 20 using mounting hardware 23 and 24, and for also attaching it to equipment rack 14 using similar mounting hardware. In addition to steel, such brackets are also made of aluminum and other conductive materials. Referring to FIG. 2a, bracket 22 advantageously has a semi-circular slot 27 disposed at the bottom of face 22a and an identical second slot 33 disposed at the upper edge of face 22a. The purpose of slot 27 is to facilitate mounting of whatever equipment is to be mounted in rack 14. By placing an added slot 33 at the top of the bracket, it eliminates the need for two separate brackets since the same mechanical bracket can be used for both sides of the equipment.

Figure 3:
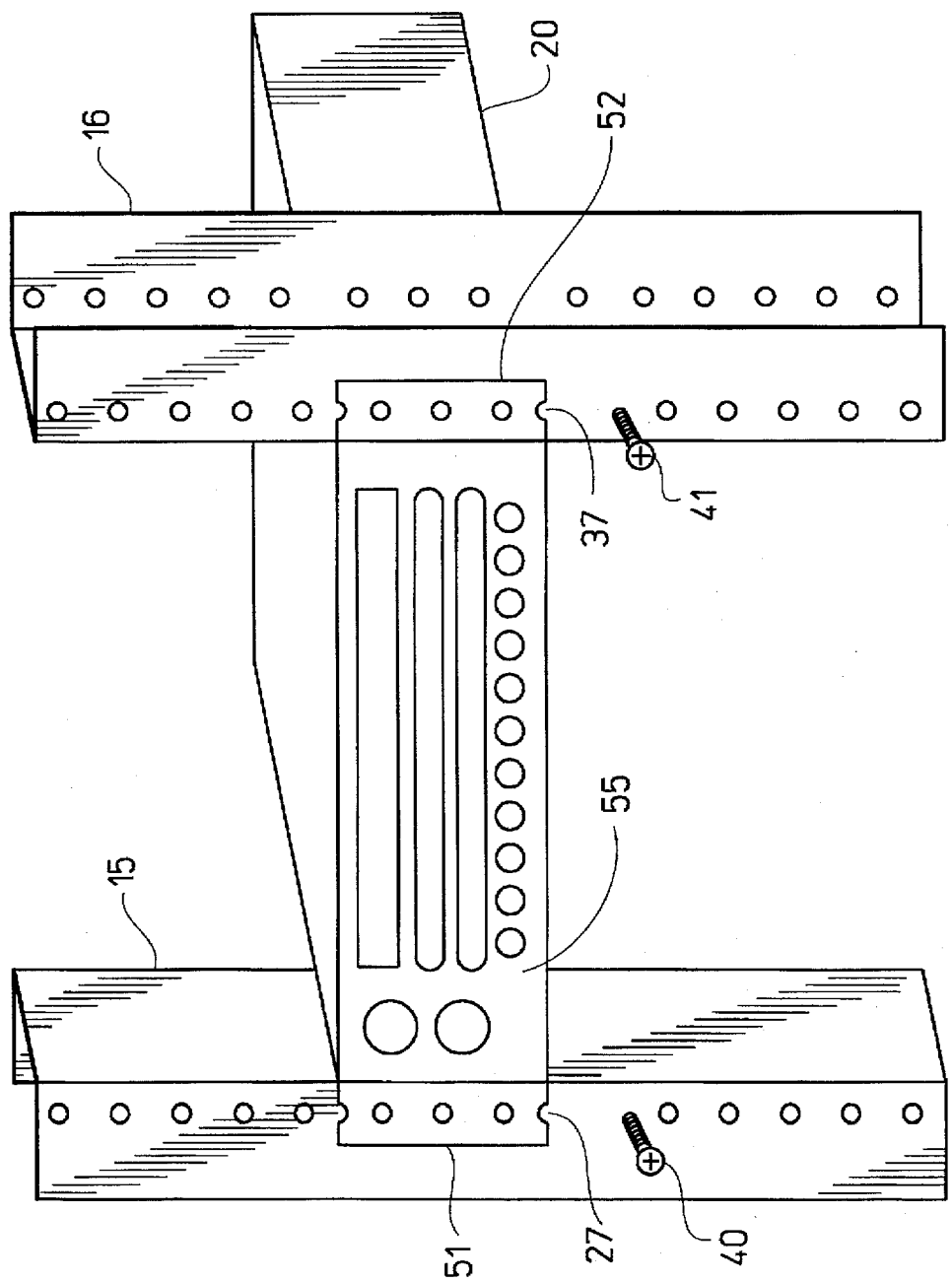
FIG. 3 is a front perspective view of the electrical equipment shelf being mounted on the equipment rack shown in FIG. 1 illustrating an embodiment of the present invention.

When bracket 22 is attached to equipment 20 and used in combination with another bracket disposed on the opposing side of equipment 20 (not shown in FIG. 2), the entire assembly can be mounted in rack 14 by attaching screws through bore holes 30 into the threaded bores in rack 14. Referring to FIG. 3, partially inserted screws 40 and 41 are slidingly received by slots 27 and 37, respectively. This occurs when equipment 20 with side brackets attached is lowered from the position shown in FIG. 3. Clearly, since the bulk of the weight of equipment 20 is posterior to the point of attachment to rack 14, a torque is applied by the weight which is opposed by the head of screws 40 and 41. Therefore equipment 20 may be released from the grasp of the installer and temporarily situated in place on the rack by these two screws enabling the installer to secure both brackets with appropriate mounting hardware. The advantage of this arrangement is that the installer has both hands free to permanently secure the equipment in place in the rack.

The preferred configuration of slots 27 and 37 is as shown in FIG. 2a. The semi-circular channel upon which screw 40 rests is preferably recessed ¼" (6.3 mm) or more from the end of the bracket. This recess is needed to prevent very heavy items that are attached to the bracket from slipping out while temporarily resting on the support screws 40 and 41.

The above illustrated and described preferred embodiment of the invention may be altered in a variety of ways and still remain within the spirit and scope of the invention. For example, the same inventive concept can be applied to what is common called an equipment shelf into which are plugged printed circuits or other components. Instead of needing a separate bracket to mount the shelf in a rack as shown in FIG. 2, the same technique can be applied to the flange that protrudes from the sides of such shelves. As depicted in FIG. 3, elements 51 and 52 which hold equipment 20 in place, could be made to be an integral part of the equipment whether by an extension of the equipment face 55 or a flange extending from the sides of equipment 20 (not shown). Such side flanges are commonly employed to mount equipment shelves in standard racks and thus avoid the need for separate mounting brackets. Furthermore, although the invention has been described in reference to a standard equipment rack (14), the same concept can be applied to installing electrical equipment in a specialized electrical cabinet.

Although equipment 20 has been variously described as an electrical equipment shelf, clearly the subject invention has applicability to almost any housing, box or enclosure, electrical or otherwise, that mounts into a rack or cabinet of the type herein described. Accordingly the term "equipment" should be read in the broadest possible sense.

Accordingly, the disclosure of the present invention is intended to be illustrative of the scope of the invention which is set forth in the following claims.

What is claimed is:

1. A pair of brackets for mounting equipment on an equipment rack frame having two structural side supports and a multitude of tapped bore holes vertically aligned therein, said pair of brackets comprising:

a first bracket having means for connection to one side of said equipment and having a first flange member for connection to and overlapping one of said rack frame side supports, said first flange member having at least one bore hole therein capable of being axially aligned with a desired one of said tapped bore holes in one of said side supports, said first flange member also having a first slot located at a bottom edge of said first flange member and spaced apart from said one bore hole so that both are capable of being axially aligned with at least a pair of said tapped bore holes in said one of said side supports, wherein said first slot is open at the bottom edge of said first flange member, and said one bore hole in said first flange member and said first slot are vertically aligned so that said one bore hole in said first flange member is located between a top edge of said first flange member and said first slot; and a second bracket have a means for connection to the other side of said equipment and having a second flange member for connection to the other one of said rack frame side supports, said second flange member having at least one bore hole therein capable of being axially aligned with a desired one of said tapped bore holes in the other one of said rack frame side supports, said second flange member also having a second slot located at the bottom edge of said second flange member spaced apart from said one bore hole so that both are capable of being axially aligned with at least a pair of said tapped bore holes, wherein said second slot is open at the bottom edge of said second flange member, and said one bore hole in said second flange member and said second slot are vertically aligned so that said one bore hole in said second flange member is located between a top edge of said second flange member and said second slot;

said first and second slots capable of supporting said equipment in a stable position relative to said rack frame when said first and second slots are engaged over partially inserted screws in both of said side supports of said rack frame.

2. A pair of brackets as in 1 wherein the first slot is a semi-circular slot and the second slot is a semi-circular slot.

3. A pair of brackets for mounting equipment on a rack frame having two structural side supports and a multitude of longitudinally spaced tapped bore holes vertically aligned therein, said pair of brackets comprising:

a first bracket for having means for connection to one side of said equipment and having a generally rectangular first flange member for connection to one of said rack frame side supports, said first flange member having a first slot located at a bottom marginal edge of said first flange member suitable for engagement with a screw body partially inserted into one of said tapped bore holes in one of said side supports, said first flange member also having at least one bore hole therein spaced apart from said first slot so that both are capable of being axially aligned with at least a pair of said tapped bore holes in said one of said side supports, wherein said first slot is open at the bottom marginal edge of said first flange member, and said one bore hole in said first flange member and said first slot are vertically aligned so that said one bore hole in said first flange member is located between a top edge of said first flange member and said first slot; and a second bracket having means for connection to the other side of said equipment and having a generally rectangular second flange member for connection to the other one of said rack frame side supports, said second flange member having a second slot located at the bottom marginal edge of said second flange member suitable for engagement with a screw body partially inserted into one of said tapped bore holes in said other one of said rack frame side supports, said second flange member also having at least one bore hole therein and spaced apart from said second slot so that both are capable of being axially aligned with at least a pair of said tapped bore holes in the other one of said rack frame side supports, wherein said second slot is open at the bottom marginal edge of said second flange member, and said one bore hole in said second flange member and said second slot are vertically aligned so that said one bore hole in said second flange member is located between a top edge of said second flange member and said second slot;

said first and second slots in said first and second brackets, respectively, capable of supporting said equipment disposed therebetween in a stable position relative to said rack frame when said first and second slots are engaging the screw body of partially inserted screws in each of said side supports of said rack frame.

4. A pair of brackets as defined in claim 3, in which said first and second slots include an elongated channel coextensive with said first and second slots and extending to the bottom marginal edge of said flanges, each of said channels having a width suitable to accommodate at least the body of a screw inserted into said side supports of said rack frame.

5. A pair of brackets as defined in claim 4 wherein each of said brackets is fabricated from angle iron.

6. An apparatus as in 3 wherein the first slot is a semi-circular slot and the second slot is a semi-circular slot.

7. Apparatus for mounting equipment on an equipment rack having two side supports and a multitude of tapped threaded holes vertically aligned therein, said apparatus comprising:

first and second flange members each adapted to extend from opposing sides of said equipment for connection to a corresponding side support of said equipment rack when said equipment is inserted between said equipment rack side supports, said first flange member having at least one bore hole therein and spaced apart from a first slot located at a bottom marginal edge of said first flange member suitable for engagement with a screw body partially inserted into one of said tapped bore holes in said equipment rack side supports, said second flange member having at least one bore hole therein and spaced apart from a second slot located at the bottom marginal edge of said second flange member suitable for engagement with a screw body partially inserted into one of said tapped bore holes in the corresponding equipment rack side supports;

said first and second slots capable of supporting said equipment in a stable position relative to said equipment rack when said first and second flanges are slid into partially inserted screws in said side supports of said rack frame;

wherein said first slot is open at the bottom marginal edge of said first flange member, and said one bore hole in said first flange member and said first slot are vertically aligned so that said one bore hole in said first flange member is located between a top edge of said first flange member and said first slot; and, wherein said second slot is open at the bottom marginal edge of said second flange member, and said one bore hole in said second flange member and said second slot are vertically aligned so that said one bore hole in said second flange member is located between a top edge of said second flange member and said second slot.

8. Apparatus as defined in claim 7, in which said first and second slots each include an elongated channel coextensive with said slots and extending to the bottom marginal edge of said flanges, each of said channels having a width suitable to accommodate at least the body of a screw inserted into said side supports of said rack frame.

9. Apparatus as defined in claim 8 wherein said first and second flange members are generally rectangularly shaped.

10. An apparatus as in 7 wherein the first slot is a semi-circular slot and the second slot is a semi-circular slot.

11. Apparatus for mounting equipment on an equipment rack having two side supports and a multitude of tapped threaded holes vertically aligned therein, said equipment having an integral faceplate, said mounting apparatus comprising:

first and second flange members each adapted to extend from opposing sides of said faceplate for connection to a corresponding side support of said equipment rack when said equipment is inserted between said equipment rack side supports, said first flange member having at least one bore hole therein and spaced apart from a first slot located at the bottom marginal edge of said first flange member suitable for engagement with a screw body partially inserted into one of said tapped threaded holes in said equipment rack side supports, said second flange member having at least one bore hole therein and spaced apart from a second slot located at the bottom marginal edge of said second flange member suitable for engagement with a screw body partially inserted into one of said tapped threaded holes in the corresponding equipment rack side support;

said first and second slots capable of supporting said equipment in a stable position relative to said equipment rack when said first and second flanges are slid into partially inserted screws in said side supports of said equipment rack;

wherein said first slot is open at the bottom marginal edge of said first flange member, and said one bore hole in said first flange member and said first slot are vertically aligned so that said one bore hole in said first flange member is located between a top edge of said first flange member and said first slot; and, wherein said second slot is open at the bottom marginal edge of said second flange member, and said one bore hole in said second flange member and said second slot are vertically aligned so that said one bore hole in said second flange member is located between a top edge of said second flange member and said second slot.

12. Apparatus as defined in claim 11, in which said first and second slots each include an elongated channel coextensive with said slots and extending to the bottom marginal edge of said flanges, each of said elongated channels having a width suitable to accommodate at least the body of a screw inserted into said side supports of said equipment rack.

13. An apparatus as in 11 wherein the first slot is a semi-circular slot and the second slot is a semi-circular slot.

* * * * *

UNITED STATES PATENT AND TRADEMARK OFFICE
CERTIFICATE OF CORRECTION

PATENT NO. : 5,709,359  Page 1 of 1
DATED : January 20, 1998
INVENTOR(S) : Richard F. Riley It is certified that error appears in the above-identified patent and that said Letters Patent is hereby corrected as shown below:

<u>Column 6,</u>
Line 10, delete "bore" and insert therefor -- threaded --

Signed and Sealed this

Fourth Day of May, 2004

JON W. DUDAS
*Acting Director of the United States Patent and Trademark Office*